(12) United States Patent
Pittroff et al.

(10) Patent No.: US 11,149,347 B2
(45) Date of Patent: Oct. 19, 2021

(54) PROCESS FOR ETCHING, AND CHAMBER CLEANING AND A GAS THEREFOR

(71) Applicants: SOLVAY SA, Brussels (BE); FRAUNHOFER-GESELLSCHAFT ZUR FÖRDERUNG DER ANGEWANDTEN FORSCHUNG E.V., Munich (DE)

(72) Inventors: Michael Pittroff, Hannover (DE); Robert Wieland, Munich (DE); Jamila Boudaden, Munich (DE)

(73) Assignees: Solvay SA, Brussels (BE); FRAUNHOFER-GESELLSCHAFT ZUR FÖRDERUNG DER ANGEW ANDTEN FORSCHUNG E.V., Munich (DE)

( * ) Notice: Subject to any disclaimer, the term of this patent is extended or adjusted under 35 U.S.C. 154(b) by 33 days.

(21) Appl. No.: 15/575,450

(22) PCT Filed: May 4, 2016

(86) PCT No.: PCT/EP2016/060021
§ 371 (c)(1),
(2) Date: Nov. 20, 2017

(87) PCT Pub. No.: WO2016/188718
PCT Pub. Date: Dec. 1, 2016

(65) Prior Publication Data
US 2018/0163300 A1     Jun. 14, 2018

(30) Foreign Application Priority Data

May 22, 2015  (EP) ..................... 15168904

(51) Int. Cl.
*C23C 16/44* (2006.01)
*B08B 7/00* (2006.01)
*H01J 37/32* (2006.01)
*B08B 5/00* (2006.01)
*B08B 9/08* (2006.01)
*H01L 21/311* (2006.01)

(52) U.S. Cl.
CPC ............ *C23C 16/4405* (2013.01); *B08B 5/00* (2013.01); *B08B 7/0035* (2013.01); *B08B 9/08* (2013.01); *H01J 37/32357* (2013.01); *H01J 37/32862* (2013.01); *H01J 2237/3321* (2013.01); *H01L 21/31116* (2013.01)

(58) Field of Classification Search
CPC combination set(s) only.
See application file for complete search history.

(56) References Cited

U.S. PATENT DOCUMENTS

| 9,757,775 | B2 | 9/2017 | Diana |
| 2002/0011210 | A1* | 1/2002 | Satoh ................. C23C 16/4405 118/715 |
| 2009/0068844 | A1 | 3/2009 | Pischtiak et al. |
| 2011/0233104 | A1 | 9/2011 | Olschimke |

FOREIGN PATENT DOCUMENTS

| WO | 2007116033 A1 | 10/2007 |
| WO | 2015173003 A1 | 11/2015 |

OTHER PUBLICATIONS

Hwang J. et al, "Effects of N2 addition on chemical dry etching of silicon oxide layers in F2/N2/Ar remote plasmas", Journal of Vacuum Science and Technology: Part A, AVS/AIP, Melville, NY, US, vol. 24, No. 4, Jun. 22, 2006, pp. 1380-1385.

* cited by examiner

*Primary Examiner* — Erin F Bergner
(74) *Attorney, Agent, or Firm* — Osha Bergman Watanabe & Burton LLP

(57) ABSTRACT

The present invention relates to a process for cleaning chambers of apparatus used for semiconductor manufacturing with a gas mixture comprising or consisting of fluorine, nitrogen and argon as well as said gas mixtures.

9 Claims, No Drawings

PROCESS FOR ETCHING, AND CHAMBER CLEANING AND A GAS THEREFOR

This application is a U.S. national stage entry under 35 U.S.C. § 371 of International Application No. PCT/EP2016/060021 filed May 4, 2016, which claims priority to European application No. 15168904.9 filed May 22, 2015. The entire contents of these applications are explicitly incorporated herein by this reference. The present invention relates to a process for cleaning chambers of apparatus used for semiconductor manufacturing with a gas mixture comprising or consisting of fluorine, nitrogen and argon as well as said gas mixtures.

This application claims priority to European application No. 15168904.9 filed May 22, 2015, the whole content of this application being incorporated herein by reference for all purposes. The present invention relates to a process for cleaning chambers of apparatus used for semiconductor manufacturing with a gas mixture comprising or consisting of fluorine, nitrogen and argon as well as said gas mixtures.

Treatment chambers are widely used to manufacture semiconductors, flat panel displays or photovoltaic elements. The manufacture generally comprises operations such as etching or chemical vapor deposition of a substrate which, during the treatment, is typically located on a support provided inside the treatment chamber. During the manufacture of semiconductors, photovoltaic cells, thin film transistor (TFT) liquid crystal displays, and micro-electromechanical systems (MEMS), often consecutive steps of deposition of material, e.g. by chemical vapor deposition (CVD), are performed on a substrate in the treatment chamber. During operation of the respective apparatus, depositions not only occur on the substrates, but also for example on the inside walls of the treatment chamber. Regular removal of such deposits is desirable to obtain stable and repeatable deposition results and is generally performed by etching said deposits with a gas containing fluorine atoms.

$NF_3$ is widely used in the industry as the etching gas. However, $NF_3$ is a greenhouse gas, with a global warming potential (GWP) 17,200 times greater than that of $CO_2$ when compared over a 100-year period. Thus, alternative etching gases have been proposed, such as $COF_2$ or molecular fluorine. WO 2013/092770 discloses ternary mixtures of fluorine, nitrogen and argon with a relatively low content of argon in the mixture.

However, there is still a need for improved processes and gas mixtures used for the cleaning of treatment chambers. Consequently, one objective of the present invention is to identify improved processes and gas compositions as etching gas for the cleaning of treatment chambers. The process and gas mixture of the present invention advantageously lead to an improved etch rate of the unwanted deposits in the treatment chamber, lead to an reduced time of the overall cleaning process, to a more effective cleaning of the treatment chamber, to a reduction in the consumption of fluorine-containing etching gas and/or to a more economical cleaning process. A further objective is to provide a gas mixture that can more effectively and readily replace $NF_3$ as the etching gas in the cleaning process.

These and other objectives are achieved by the process and the gas mixture according to the present invention.

Accordingly, a first aspect of the present invention concerns a process for cleaning the treatment chamber of an apparatus used for semiconductor manufacturing wherein a gas mixture comprising or consisting of fluorine in a range of equal to or greater than 20% (v/v) to equal to or less than 40% (v/v), nitrogen in a range of equal to or greater than 25% (v/v) to equal to or less than 45% (v/v) and argon in a range of equal to or greater than 25% (v/v) to equal to or less than 45% (v/v), relative to the total composition of fluorine, argon, nitrogen and optional other components as 100% (v/v), is used as the etching gas. Preferably, the gas mixture comprises or consists of fluorine in a range of equal to or greater than 25% (v/v) to equal to or less than 35% (v/v), nitrogen in a range of equal to or greater than 25% (v/v) to equal to or less than 35% (v/v) and argon in a range of equal to or greater than 35% (v/v) to equal to or less than 45% (v/v), relative to the total composition of fluorine, argon, nitrogen and optional other components as 100% (v/v). More preferably, the gas mixture comprises or consists of fluorine in a range of equal to or greater than 27.5% (v/v) to equal to or less than 32.5% (v/v), nitrogen in a range of equal to or greater than 27.5% (v/v) to equal to or less than 32.5% (v/v) and argon in a range of equal to or greater than 37.5% (v/v) to equal to or less than 42.5% (v/v), relative to the total composition of fluorine, argon, nitrogen and optional other components as 100% (v/v). Specifically, the gas mixture consists of around 30% (v/v) fluorine, around 30% (v/v) nitrogen and around 40% (v/v) argon.

Preferably, the gas mixture may consist of only fluorine, nitrogen and argon. Alternatively, the gas mixture may contain other components like neon, oxygen, helium, N2O, NO, or mixtures thereof.

The term "around" is intended to denote that the components are present in the gas mixture according to the percentage values given above. However, they may also be present in the percentage given within a margin of error which is due to the technically process for the preparation of the gas mixtures. Generally, this margin of error is assumed to be around +/−0.5% (v/v).

The process for treatment chambers is generally performed in different stages. For example, a suitable process for a plasma-assisted cleaning might comprise at least 4 different stages.

The first stage is the Ignition Stage, wherein the plasma is ignited. Usually, this Ignition Stage is performed with pure argon, as argon is known to be very suitable for igniting plasma.

Surprisingly, it has now been found that the gas mixtures according to the present invention can also be used to ignite the plasma source without admixing further amounts of argon into the mixture. Thus, the complete cleaning cycle can be performed with the inventive gas mixtures without the need to switch between different gas mixtures for the individual steps.

The second stage is the Pre-clean Stage. In this stage, the etching gas generally contains less fluorine-containing gas. It may be performed if relative large amount of deposit is found in certain parts of the chamber. In order to prevent an over-heating of parts of the chamber, these large deposits are etched in this Pre-clean stage with a milder gas mixture with less fluorine.

The third stage is the Main Cleaning Stage, wherein the majority of the deposits are removed from the treatment chamber. Advantageously, the Main Cleaning Stage might be the longest stage in the cleaning process. It might also be the stage wherein the most etching has is consumed.

The fourth stage is the Post-Cleaning Stage, which generally uses an etching gas with a lower fluorine concentration. In this stage, any residual deposits in more remote and less easily accessible parts of the chamber are being etched.

Preferably, the inventive gas mixture is used in at least one of the cleaning stages. More preferably, it is used in the Main Cleaning Stage.

The cleaning of the treatment chamber is generally performed at relatively low pressures; a suitable value for the Main Cleaning Stage is 4 Torr. Surprisingly, it has been found that the inventive gar mixtures allow for even lower pressures in the chamber, likely due to their higher reactivity. Accordingly, the process is preferably performed at a pressure in the chamber in the range between 1 and 3.5 Torr, more preferably at a pressure of around 3 Torr.

Often, the cleaning process is assisted by plasma. Plasma can be generated by applying a high frequency voltage between opposed electrodes or in a magnetron which provides microwaves the frequency of which is to the upper range of radio frequencies. The electromagnetic waves heat up the gas phase inside the plasma reactor. Atoms with high reactivity are formed, e.g. F atoms which then etch matter away, forming volatile reaction products. Surprisingly, the inventive gas mixtures allow for a relative low frequency to be used while maintaining a stable plasma. Accordingly, another embodiment is a process wherein the process is plasma-assisted using a remote plasma source with a frequency from 100 KHz to 1 GHz, preferably around 400 KHz.

$NF_3$ is currently one of the most commonly used etching gases for chamber cleaning. Thus, it would be advantageous to provide gas mixtures that allow for the replacement of the $NF_3$ with minimal modifications to the apparatus and its tuning. This is generally referred to as "drop-in" substitution. Surprisingly, it has been shown that the inventive gas mixtures can not only be used on apparatus optimized and/or tuned for the use with $NF_3$ but provides even improved results as compared to $NF_3$. Accordingly, another embodiment concerns a process wherein the apparatus is optimized for the use of $NF_3$ as etching gas.

The deposits to be removed in the cleaning process comprise inorganic materials like Si, $Si_3N_4$, $SiO_xN_y$, wherein 0<x≤3 and 0≤y≤4, $SiO_2$, TaN, TiN or W. Accordingly, another embodiment of the present invention concerns a process wherein Si, $Si_3N_4$, $SiO_xN_y$, wherein 0<x≤3 and 0≤y≤4, $SiO_2$, TaN, TiN or W, more preferably $SiO_2$, is removed by etching with the etching gas.

In a second aspect, the present invention concerns a gas mixture comprising or consisting of fluorine in a range of equal to or greater than 20% (v/v) to equal to or less than 40% (v/v), nitrogen in a range of equal to or greater than 25% (v/v) to equal to or less than 45% (v/v) and argon in a range of equal to or greater than 25% (v/v) to equal to or less than 45% (v/v), relative to the total composition of fluorine, argon, nitrogen and optional other components as 100% (v/v).

Preferably, the gas mixture comprises or consists of fluorine in a range of equal to or greater than 25% (v/v) to equal to or less than 35% (v/v), nitrogen in a range of equal to or greater than 25% (v/v) to equal to or less than 35% (v/v) and argon in a range of equal to or greater than 35% (v/v) to equal to or less than 45% (v/v), relative to the total composition of fluorine, argon, nitrogen and optional other components as 100% (v/v). More preferably, the gas mixture comprises or consists of fluorine in a range of equal to or greater than 27.5% (v/v) to equal to or less than 32.5% (v/v), nitrogen in a range of equal to or greater than 27.5% (v/v) to equal to or less than 32.5% (v/v) and argon in a range of equal to or greater than 37.5% (v/v) to equal to or less than 42.5% (v/v), relative to the total composition of fluorine, argon, nitrogen and optional other components as 100% (v/v). Specifically, the gas mixture consists of around 30% (v/v) fluorine, around 30% (v/v) nitrogen and around 40% (v/v) argon. In another specific embodiment, the gas mixture consists of around 30% (v/v) fluorine, around 45% (v/v) nitrogen and around 25% (v/v) argon or the gas mixture consists of 30% (v/v) fluorine, 45% (v/v) nitrogen and 25% (v/v) argon.

In a third aspect, the invention concerns the use of the gas mixture as etching gas for the cleaning of chambers of apparatus used in semiconductor manufacturing, for example in the process as described above. Preferably, the gas mixture is used as a drop-in replacement for $NF_3$.

The inventive gas mixtures can easily be prepared by condensing or pressing the desired amounts of fluorine, argon and nitrogen into a pressure bottle.

Should the disclosure of any patents, patent applications, and publications which are incorporated herein by reference conflict with the description of the present application to the extent that it may render a term unclear, the present description shall take precedence.

The following examples shall explain the invention in further detail, but they are not intended to limit the scope of the invention.

EXAMPLES

1. Determination of Etch Rates:

The etch rates were determined in situ by reflectometry using a 645 nm laser directed to the sample. The etch rate was calculated by dividing the thickness of the film by the time when the removal endpoint was detected.

2. Samples:

The size of the samples was a 200 mm wafer. The investigated material was deposited on a 150 nm thermal $SiO_2$ layer to allow interferometric measurement. The $SiO_2$ samples were deposited on bulk silicon since their optical properties allow interferometric measurements.

3. Chamber Cleaning Experiments on Alta-CVD

The experiments were performed on an AltaCVD Tool with a two-chamber system with "Brooks VX400" loader. Chamber PM2 was used for doped/undoped poly-Si films. The heater temperature was set to 400° C., the wall temperature was 55° C.

An MKS "Paragon" remote plasma source optimiszed for $NF_3$ was used with a frequency of 400 kHz. The dissociated ions and radicals enter the chamber near the slit valve and flow between heater and shower head. The remote plasma source was usually ignited in the presence of pure argon. Directly after the plasma was in a stable condition, the gas mixture comprising fluorine was introduced.

The respective gas mixture was delivered to the machine from gas cylinders with the size of 10 l. The apparatus was equipped with a "Brooks GF 125" digital mass flow controller, metal sealed, VCR suitable for all kind of corrosive gases.

A cleaning process was than performed with three individual cleaning steps (pre-clean, main clean and post clean) for a combined time of 45 s.

Example 1: Chamber Cleaning with Different $F_2/Ar/N_2$ Mixtures

A 1-2 μm thick PETEOS-film was deposited on 200 mm Si-substrates and thickness measured with spectrometer (OMT)/ellipsometer (tencor UV1280SE), 49 points, 10 mm edge exclusion. Wafers were loaded into the chamber. $SiO_2$-etch rates were calculated after measuring post-etch TEOS film thickness.

For each example, the main cleaning step (second row) was done with the pure etching gas mixture while the preand post-cleaning steps were performed with the addition of 1140 and 850 sccm ("standard cubic centimeter"), respectively. The other parameters (step time t, pressure p and respective flow rates of argon, etching gas and total gas) are given in the table below.

Example 1a shows the inventive mixture whereas the comparative examples 1b and 1c were performed with gas mixtures outside the claimed range.

Results:

| Example 1: F2/N2/Ar (30%/45%/25%) | | | | | |
|---|---|---|---|---|---|
| t [s] | p [Torr] | Ar [sccm] | Etch gas [sccm] | Total [sccm] | Etch Rate [nm/mm] | F-Gas [g] |
| 5 | 3 | 1140 | 450 | 1590 | 1343 | |
| 12 | 3 | 0 | 1660 | 1860 | | |
| 12 | 4 | 850 | 930 | 1780 | | |

| Example 1a: F2/N2/Ar (30%/30%/40%) | | | | | | |
|---|---|---|---|---|---|---|
| t [s] | p [Torr] | Ar [sccm] | Etch gas [sccm] | Total [sccm] | Etch Rate [nm/mm] | F-Gas [g] |
| 5 | 3 | 1140 | 450 | 1590 | 1253 | 0.30 |
| 12 | 3 | 0 | 1860 | 1860 | | |
| 12 | 4 | 850 | 930 | 1780 | | |

| Comparative Example 1b: F2/N2/Ar (30%/20%/50%) | | | | | |
|---|---|---|---|---|---|
| t [s] | p [Torr] | Ar [sccm] | Etch gas [sccm] | Total [sccm] | Etch Rate [nm/min] |
| 5 | 3 | 1140 | 450 | 1590 | 1127 |
| 12 | 3 | 0 | 1860 | 1860 | |
| 12 | 4 | 850 | 930 | 1780 | |

| Comparative Example 1c: F2/N2/Ar (30%/50%/20%) | | | | | |
|---|---|---|---|---|---|
| t [s] | p [Torr] | Ar [sccm] | Etch gas [sccm] | Total [sccm] | Etch Rate [nm/min] |
| 5 | 3 | 1140 | 450 | 1590 | 1098 |
| 12 | 3 | 460 | 1400 | 1860 | |
| 12 | 4 | 1080 | 700 | 1780 | |

The results show that surprisingly, the etch rate shows an unexpected maximum value of 1253 nm/min for the inventive gas mixture $F_2/N_2/Ar$ (30%/30%/40% each v/v) and another unexpected maximum of 1343 nm/min for a gas mixture F2/N2/Ar (30%/45%/25% each v/v). Variation of the nitrogen and argon content just outside the claimed range results in a decrease of etch rate. The inventive gas mixture of experiment 1a leads to etch rates more than 10% higher than the next best result with the gas mixture of comparative experiment 1b.

Comparative Example 2: Chamber Cleaning with $NF_3$/Ar Mixtures

Three different cleaning processes were performed with different $NF_3$/Ar mixtures as shown in the table below. All other parameters were identical to the ones referred to in Experiment 1.

Results:

| Comparative Experiment 2 (NF3/Ar) | | | | | | |
|---|---|---|---|---|---|---|
| t [s] | p [Torr] | Ar [sccm] | NF3 [sccm] | Total [sccm] | SiO2 Rate [nm/mm] | F-Gas [g] |
| 5 | 3 | 1500 | 90 | 1590 | 1123 | 0.37 |
| 12 | 3 | 1500 | 360 | 1860 | | |
| 12 | 4 | 1600 | 180 | 1780 | | |
| 5 | 3 | 1500 | 90 | 1590 | 846 | 0.25 |
| 12 | 3 | 1620 | 240 | 1860 | | |
| 12 | 4 | 1660 | 120 | 1780 | | |
| 5 | 3 | 1500 | 90 | 1590 | 621 | 0.18 |
| 12 | 3 | 1700 | 160 | 1860 | | |
| 12 | 4 | 1700 | 80 | 1780 | | |

The results show that the inventive gas mixture of experiment 1a leads to etch rates more than 10% higher than the next best result with the $NF_3$/Ar gas mixture of comparative experiment 2. Additionally, the consumption of fluorine (calculation based on the total weight of fluorine atoms consumed, last column) is clearly higher in the best result of Comparative Example 2 compared to the consumption calculated for result with the inventive mixture of Experiment 1a.

The invention claimed is:

1. A process for cleaning a treatment chamber of an apparatus used for semiconductor manufacturing, the process comprising cleaning the treatment chamber with an etching gas, wherein the etching gas is a gas mixture consisting of around 30% (v/v) fluorine, nitrogen greater than or around 30% (v/v) to equal to or less than 45% (v/v) and argon in a range of equal to or greater than 25% (v/v) to less than or around 40% (v/v), relative to the total composition of fluorine, argon, and nitrogen as 100% (v/v).

2. The process of claim 1 wherein the gas mixture consists of around 30% (v/v) fluorine, around 30% (v/v) nitrogen and around 40% (v/v) argon.

3. The process of claim 1 wherein the gas mixture is used in a main chamber cleaning step.

4. The process of claim 1 wherein the pressure in the chamber is in the range between 1 and 3.5 Torr.

5. The process of claim 1 wherein the process is plasma-assisted using a remote plasma source with a frequency from 100 KHz to 1 GHz.

6. The process of claim 1 wherein the apparatus is optimized for the use of $NF_3$ as etching gas.

7. The process of claim 1 wherein an inorganic material selected from the group consisting of amorphous Si, $Si_3N_4$, $SiO_xN_y$, wherein $0<x\leq3$ and $0\leq y\leq4$, $SiO_2$, TaN, TiN and W is removed by etching with the etching gas.

8. The process of claim 7 wherein $SiO_2$ is removed by etching with the etching gas.

9. The process of claim 5, wherein the process is plasma-assisted using a remote plasma source with a frequency around 400 KHz.

* * * * *